March 2, 1965 R. C. RUHLAND 3,171,982
DIFFERENTIAL AMPLIFIER WITH SUPPLY VOLTAGE COMPENSATION
Filed Aug. 27, 1962
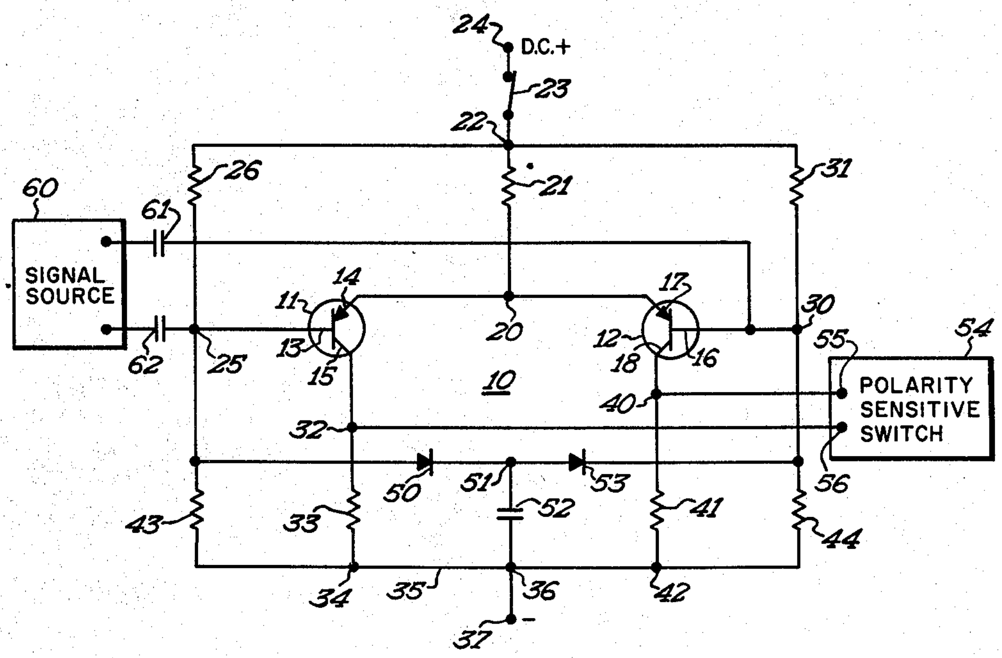
INVENTOR.
ROMAN C. RUHLAND
BY Dmund R. Dahle
ATTORNEY United States Patent Office 3,171,982

Patented Mar. 2, 1965

3,171,982

DIFFERENTIAL AMPLIFIER WITH SUPPLY VOLTAGE COMPENSATION

Roman C. Ruhland, St. Louis Park, Minn., assignor to Honeywell Inc., a corporation of Delaware Filed Aug. 27, 1962, Ser. No. 219,486
8 Claims. (Cl. 307—88.5)

This invention relates generally to new and improved transistor circuitry for use in control systems. In certain control systems in which a transistor amplifier operates to trigger a polarity sensitive switch connected to the output thereof, it often occurs that variations in the supply line volage to the transistor amplifier results in a transient output from the amplifier to the polarity sensitive switch resulting in unwanted operation of the switch. In the present invention a novel improvement to the amplifier circuit prevents variations in supply line voltage from producing output voltages of one specific polarity from appearing across the amplifier output terminals.

More specifically, in a differential amplifier containing all perfectly matched components line voltage variations do not normally produce an output signal from the amplifier. In practice however, it is not possible or economically feasible to produce differential amplifiers having perfectly matched components and as a result line voltage variations do produce D.C. signals at the amplifier output. Applicant has found it imperative therefore to provide improved differential amplifier means for preventing line voltage variations from triggering the polarity sensitive switch.

It is an object of this invention to provide in a differential amplifier means for preventing spurious output voltages of one specific polarity from occurring due to variations in supply line voltage.

It is a more specific object of this invention in which a differential amplifier is used to trigger a polarity sensitive switch at the output terminals thereof, to provide means which prevent variations in supply line voltage to the amplifier from producing output voltages of one specific polarity from appearing across the amplifier output terminals.

These and other objects of the invention will become more apparent upon a further consideration of the specification, claims and drawing of which:

A single figure of the drawing is a schematic representation of an embodiment of the invention.

Referring now to the drawing, there is disclosed generally at 10 a differential amplifier comprising a pair of current control members 11 and 12, here shown as being pnp type transistors. Transistor 11 has a base electrode 13 and an emitter electrode 14 and a collector electrode 15. Transistor 12 has a base electrode 16, an emitter electrode 17 and a collector electrode 18. The emitter electrodes 14 and 17 are directly connected together at a junction 20 and are further connected through a common emitter resistance 21, a junction 22 and a power switch 23 to the positive terminal 24 of the D.C. supply line voltage. Base electrode 13 is connected by a junction 25, and a biasing resistor 26 to the junction 22, and similarly base electrode 16 is connected by a junction 30 and a biasing resistor 31 to the junction 22.

The collector electrode 15 is connected through a junction 32, a collector load resistor 33, a junction 34, and a conductor 35 to the negative supply terminal 37. Collector electrode 18 is connected by means of a junction 40 and a collector load resistor 41 to a junction 42 on the conductor 35. Base electrode 13 is connected to junction 25 and a biasing resistor 43 to the negative conductor 35, and likewise base electrode 16 is connected by the junction 30 and a biasing resistor 44 to the negative conductor 35.

A filter network is connected between the base electrodes and the negative source terminal; a first portion of the network may be traced from base 13 through a diode 50, a junction 51 and energy storage means 52, here shown as a capacitor to a junction 36 on the conductor 35. The direction of easy current flow through the diode 50 is towards junction 51. A further portion of the filter network circuit may be traced from the junction 51 through a diode 53 to the base electrode 16 with the direction of easy current flow of diode 53 being towards base electrode 16.

The polarity sensitive switch 54 is connected directly across the output circuit of the differential amplifier by having its control terminals 55 and 56, respectively, connected to junctions 40 and 32. The polarity sensitive switch may take any of many forms, several of which are a silicon controlled rectifier, a four-layer diode, or a multi-vibrator type circuit, each of which requires a signal exceeding the threshold value and of a particular polarity to trigger the switch. A source of control signals for the differential amplifier is generally disclosed at 60, and the output terminals thereof are connected through coupling capacitors 61 and 62 to the base electrodes 13 and 16 of transistors 11 and 12, respectively.

Considering now the operation of the improved differential amplifier circuit, the purpose of the filter network comprising diodes 50 and 53 and capacitor 52, as has been previously mentioned, is to prevent variations in the supply voltage between terminals 24 and 37 from producing output voltages to the polarity sensitive switch which would be of a polarity such that terminal 55 is positive with respect to 56. It is important that this polarity of signal, which is in a direction to trigger the polarity sensitive switch 54, be applied only when the proper signal is received from signal source 60 to the differential amplifier input terminals.

Under variations in the supply voltage, the filter network operates substantially in the following manner. When the D.C. source voltage increases, an increased current tends to flow through the biasing resistors 26, 43, 31 and 44 whereby the voltages appearing at the bases 13 and 16 tend to rise proportionally. The diode 50, however, connects the capacitor 52 in parallel with the resistor 43 or in other words, the base electrode 13 to the capacitor 52 and since the capacitor 52 requires time to charge to the new voltage applied, transistor 11 is biased to be more conductive. Another way of stating the operation is that the potential at the base 13 does not rise as fast as the voltage at the base 16 of transistor 12 due to the charging of capacior 52. During this period of time the diode 53 is momentarily reverse biased and is effectively an open circuit. The effect at the amplifier output is that terminal 55 will momentarily be negative with respect to terminal 56 and therefore the switch will not be triggered by this rising voltage transient at the source.

When the D.C. source potential decreases, the bias voltages at the two base electrodes will tend to decrease proportionally. The dode 53 now becomes forward biased connecting the charge on the capacitor 52 to the base electrode 16 and across resistor 44. The potential at the base of transistor 12 is therefore prevented from decreasing as fast as the potential at the base electrode of transistor 11. A decrease in the conductivity of transistor 12 will momentarily occur and the effect at the amplifier output is the same as previously discussed, that is, terminal 55 will momentarily become negative with respect to terminal 56.

In both cases described above, the time constant of capacitor 52 and the associated circuit resistance determine the time duration of the negative voltage appearing at terminal 55. During this interval transients appearing in preceding stages, that is, line voltage transients affecting amplifier stages preceding differential stage 10, which have the proper polarity to tend to drive terminal 55 in a positive direction are also cancelled by the unbalancing action of the filter network. The result is that transients in the supply voltage cannot trigger the polarity sensitive switch which requires a positive voltage at terminal 55 with respect to terminal 56 in order to be triggered.

The transistors have been shown as being of pnp type, however, the invention is not intended to be limited to amplifiers of this specific type.

Modifications of this circuit may become apparent to those who are skilled in the art and I therefore wish it to be understood that the specific embodiment described is for illustrative purposes and that I intend to be limited solely by the scope of the appended claims.

I claim:

1. In amplifying apparatus for controlling a polarity sensitive switch in which voltage variations or transients in the amplifier supply tend to cause false operation of the polarity sensitive switch, the apparatus being arranged to prevent false operation comprising:

amplifier means including first and second semiconductor means each having a plurality of electrodes including control and output electrodes;

a source of energizing potential, said source being subject to voltage transients;

means connecting a signal source to said control electrodes;

means connecting polarity sensitive switch means to said output electrodes whereby a signal of one polarity only at said output electrodes is effective to operate said switch means;

first diode means having first and second terminals, the first terminal connected to the control electrode of said first transistor;

second diode means having first and second terminals, the second terminal connected to the control electrode of said second transistor;

energy storage means;

and means connecting said energy storage means to said first diode means second terminal and to said second diode means first terminal such that upon a voltage transient of either polarity occurring in said energizing source said diode means are effective to prevent an output of said one polarity as a result thereof from appearing at said output electrodes.

2. Transient voltage insensitive amplifying apparatus for controlling a polarity sensitive switch comprising:

differential amplifier means including first and second transistors each having a plurality of electrodes including control and output electrodes;

a source of energizing potential, said source being subject to voltage transients;

means connecting a signal source to said control electrodes;

means connecting polarity sensitive switch means to said output electrodes whereby a signal of one polarity only is effective to operate said switch means;

first diode means having first and second terminals, the first terminal connected to the control electrode of said first transistor;

second diode means having first and second terminals, the second terminal connected to the control electrode of said second transistor;

energy storage means;

and means connecting said energy storage means to said first diode means second terminal and to said second diode means first terminal such that upon a voltage transient occurring in said energizing source said diode means are effective to prevent an output of said one polarity as a result thereof.

3. Amplifying means comprising:

first and second transistors each having a plurality of electrodes including control, emitter and collector electrodes said emitter and collector electrodes being output electrodes;

circuit means connecting one of said output electrodes of each transistor to a source of potential;

means connecting the other of said output electrodes to a reference potential point;

polarity sensitive switch means having triggering electrodes connected to said other output electrodes, respectively, said switch means being operated by a predetermined polarity of signal applied to said triggering electrodes;

and filter network means connected to eliminate the undesired operation of said switch means due to voltage transients in said potential source, said filter network comprising first and second diodes and a capacitor, one terminal of each being connected to a common junction point, said first diode other terminal being connected to said first transistor base electrode, said second diode other terminal being connected to said second transistor base electrode and said capacitor other terminal being connected to said reference potential point.

4. Amplifying means comprising:

first and second transistors each having a plurality of electrodes including control, emitter and collector electrodes;

circuit means connecting said emitter electrodes to a source of potential;

means connecting said collector electrodes to a reference potential point;

polarity sensitive switch means having triggering electrodes connected to said collector electrodes, respectively, said switch means being operated by a predetermined polarity of signal applied to said triggering electrodes;

and filter network means comprising first and second diodes and a capacitor, one terminal of each being connected to a common junction point, said first diode being connected to said first transistor base electrode, said second diode being connected to said second transistor base electrode and said capacitor being connected to said reference potential point.

5. Amplifying apparatus comprising:

amplifying means including first and second signal amplifying devices each having a plurality of electrodes including control and output electrodes;

polarity sensitive switch means connected to the output electrodes of said amplifying devices and operated by a predetermined polarity of signal at said output electrodes;

first diode means having first and second terminals, the first terminal thereof connected to said first amplifying device control electrode;

second diode means having first and second terminals, the second terminal thereof being connected to said second amplifying device control electrode;

capacitor means having a first and second terminal;

and means connecting the first terminal of said capacitor means to said first diode means second terminal and to said second diode means first terminal to form an electrical filter network.

6. Amplifying apparatus comprising:

differential amplifying means including first and second signal amplifying devices having a plurality of electrodes including control and output electrodes;

polarity sensitive switch means connected to the output electrodes of said amplifying means;

first diode means having first and second terminals, the first terminal thereof connected to said first amplifying device control electrode;

second diode means having first and second terminals, the second terminal thereof being connected to said second amplifying device control electrode;

capacitor means;

and means connecting said capacitor means to said first diode means second terminal and to said second diode means first terminal to form a filter network.

7. Transient voltage insensitive amplifying apparatus for controlling a polarity sensitive switch comprising:

differential amplifier means comprising first and second semiconductor amplifying devices each having a pluarlity of electrodes including a control electrode, an input electrode and an output electrode;

a source of energizing potential having first and second terminals, said source being subject to voltage variations or voltage transients at said terminals;

means connecting a signal source to said control electrodes;

polarity sensitive switch means including triggering electrodes, said switch means being operated by a signal of a predetermined polarity;

means connecting together said input electrodes and further connecting said input electrodes to a first terminal of said source;

energy storage means having one terminal thereof connected to the second terminal of said source;

first diode means having first and second terminals, said first terminal being connected to the control electrode of said first semiconductor device and the second terminal thereof being connected to said energy storage means;

and second diode means having first and second terminals, the second terminal thereof being connected to the control electrode of said second semiconductor device, the first terminal thereof being connected to said energy storage means, said first and second diode means and said energy storage means being effective upon a voltage transient occurring in said energy source to prevent an output to said triggering electrodes of said predetermined polarity.

8. Transient voltage insensitive amplifying apparatus for controlling a polarity sensitive switch comprising:

amplifier means comprising first and second semi-conductor amplifying devices each having a plurality of electrodes including a control electrode, an input electrode and an output electrode;

a source of energizing potential having first and second terminals, said source being subject to voltage variations or voltage transients at said terminals;

means connecting a signal source to said control electrodes;

polarity sensitive switch means including triggering electrodes, said switch means being operated by a signal of a predetermined polarity;

means connecting together said input electrodes and further connecting said input electrodes to a first terminal of said potential source;

energy storage means having one terminal thereof connected to the second terminal of said source;

first diode means having fiirst and second terminals, the direction of easy current flow being towards said second terminal, said first terminal being connected to the control electrode of said first semiconductor device and the second terminal thereof being connected to said energy storage means;

and second diode means having first and second terminals, the direction of easy current flow being towards said second terminal, the second terminal thereof being connected to the control electrode of said second semiconductor device, the first terminal thereof being connected to said energy storage means, said first and second diode means and said energy storage means being effective upon a voltage transient occurring in said energy source to prevent an output to said triggering electrodes of said predetermined polarity.

No references citied.